US009534855B2

(12) United States Patent
Chauhan et al.

(10) Patent No.: US 9,534,855 B2
(45) Date of Patent: Jan. 3, 2017

(54) HIGH SPECIFIC AREA COMPOSITE FOAM AND AN ASSOCIATED METHOD OF FABRICATION

(71) Applicant: General Electric Company, Schenectady, NY (US)

(72) Inventors: Shakti Singh Chauhan, Guilderland, NY (US); Kaustubh Ravindra Nagarkar, Clifton Park, NY (US); Matthew Jeremiah Misner, Delanson, NY (US); Faisal Razi Ahmad, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/549,268

(22) Filed: Nov. 20, 2014

(65) Prior Publication Data
US 2016/0146556 A1 May 26, 2016

(51) Int. Cl.
F28F 21/02 (2006.01)
F28F 21/06 (2006.01)

(52) U.S. Cl.
CPC ............ F28F 21/02 (2013.01); F28F 21/067 (2013.01); *Y10T 428/249955* (2015.04); *Y10T 428/249958* (2015.04); *Y10T 428/249978* (2015.04)

(58) Field of Classification Search
CPC ............ F28F 21/02; Y10T 428/249955; Y10T 425/249978; Y10T 428/249958
See application file for complete search history.

(56) References Cited

U.S. PATENT DOCUMENTS

2010/0216026 A1* 8/2010 Lopatin .................... C25D 1/00
429/246
2013/0021718 A1 1/2013 Yager
(Continued)

FOREIGN PATENT DOCUMENTS

CN 102786756 A 11/2012
CN 102842354 A 12/2012
(Continued)

OTHER PUBLICATIONS

Chen et al., "Three-dimensional flexible and conductive interconnected graphene networks grown by chemical vapour deposition.", Nature Materials, vol. 10, Jun. 2011, www.nature.com/naturematerials, pp. 424-428.
(Continued)

*Primary Examiner* — Hai Vo
(74) *Attorney, Agent, or Firm* — John P. Darling

(57) ABSTRACT

Composite foams are provided including a metal template and a conformal atomic-scale film disposed over such metal template to form a 3-dimensional interconnected structure. The metal template includes a plurality of sintered interconnects, having a plurality of first non-spherical pores, a first non-spherical porosity, and a first surface-area-to-volume ratio. The conformal atomic-scale film has a plurality of second non-spherical pores, a second non-spherical porosity, and a second surface-area-to-volume ratio approximately equal to the first surface-area-to-volume ratio. The plurality of sintered interconnects has a plurality of dendritic particles and the conformal atomic-scale film includes at least one of a layer of graphene and a layer of hexagonal boron nitride.

11 Claims, 12 Drawing Sheets

(56) References Cited

U.S. PATENT DOCUMENTS

2014/0110049 A1     4/2014   Yuen et al.
2014/0116661 A1     5/2014   Xu et al.
2015/0352522 A1*   12/2015   Mizuuchi ................ B01J 37/06
                                                                               502/439

FOREIGN PATENT DOCUMENTS

| CN | 103213980 A | 7/2013 | |
|----|-------------|--------|---|
| CN | 103232027 A | 8/2013 | |
| CN | 102583339 B | 4/2014 | |
| WO | 2013180662 A1 | 12/2013 | |
| WO | WO 2014129597 A1 * | 8/2014 | .............. B01J 37/06 |

OTHER PUBLICATIONS

Lee et al., "Three-dimensional nano-foam of few-layer graphene grown by CVD for DSSC.", Royal Society of Chemistry,Physical Chemistry Chemical Physics, Science Direct, 2012, vol. 14, No. 22, 7938-7943.

* cited by examiner

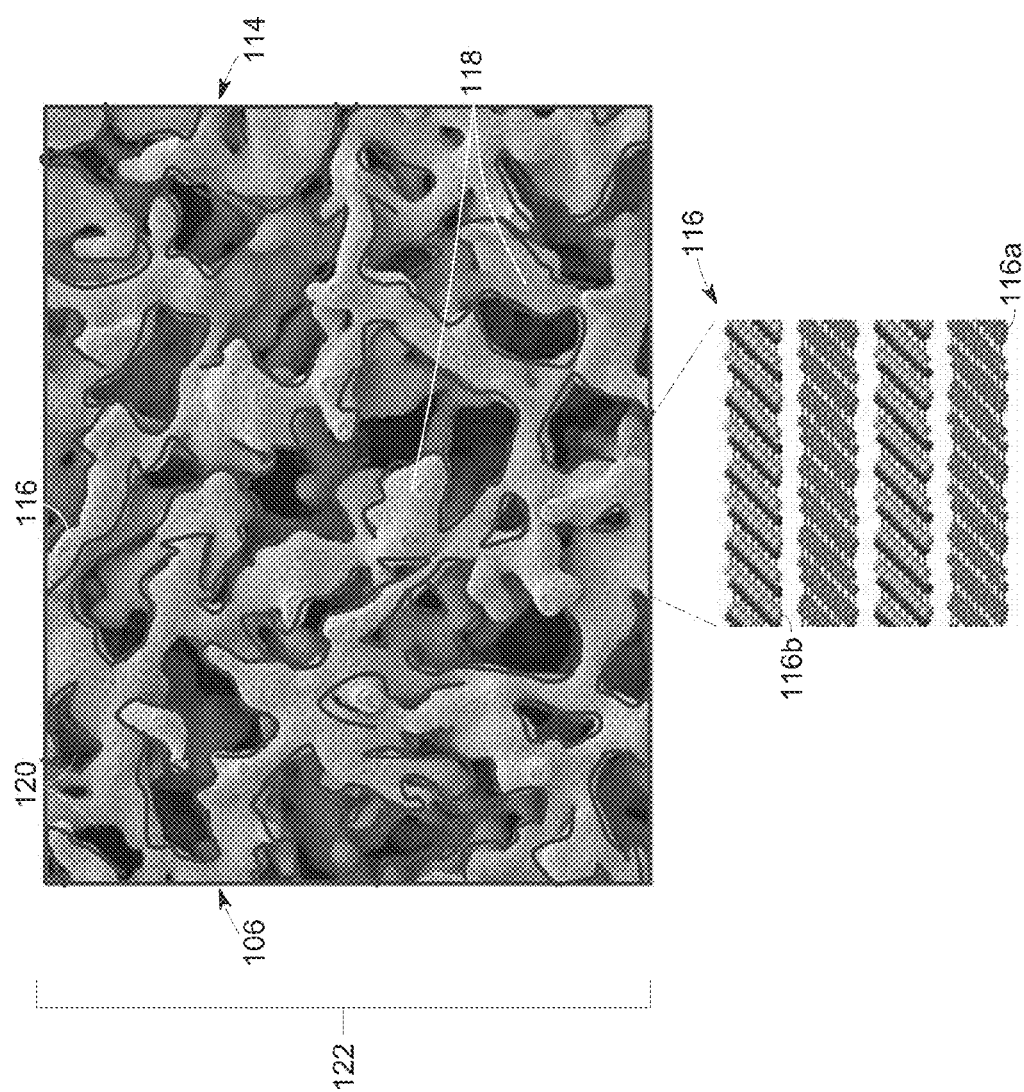

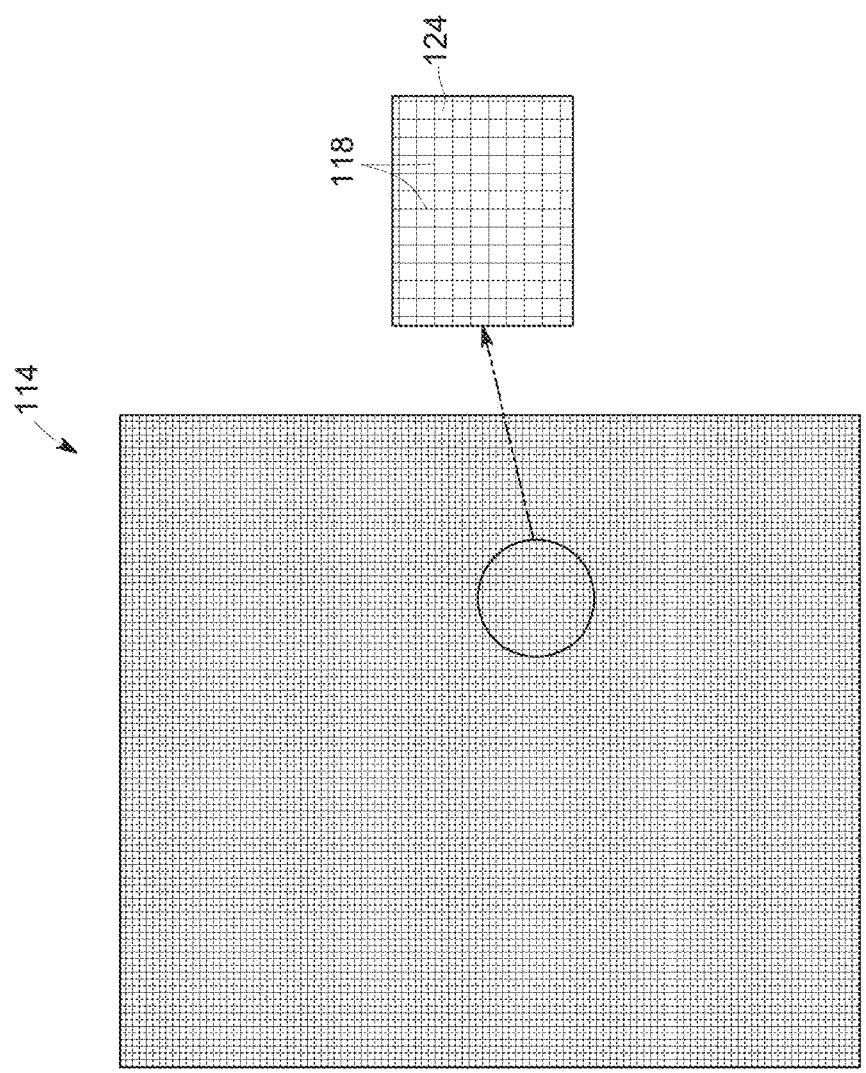

HIGH SPECIFIC AREA COMPOSITE FOAM AND AN ASSOCIATED METHOD OF FABRICATION

BACKGROUND

The present technology relates to a composite foam, and more particularly to the composite foam including a conformal atomic-scale film having a high surface-area-to-volume ratio.

In an electronics packaging industry, composite foams are typically used for providing at least one of a thermal, an electrical, and a mechanical property to an underlying electronic product and/or to one or more components used to build the electronics product.

Such composite foams used for a thermal management application may include a matrix and a nano-scale fillers deposited within the matrix. Generally, the fillers deposited within the matrix form multiple islands with no direct interconnection between the fillers. The composite foam may be made of a single layer or multiple layers of the matrix material to provide a macro-scopic structure to the composite foam.

Typically, individual fillers provide thermal and electrical property enhancements, and the matrix provides mechanical (i.e. strength) and thermal property to the composite foam. However, overall properties of such filler-matrix composite foam are typically limited by the performance of interface regions of the filler-matrix. The interface regions between the filler and the matrix typically present a very high thermal and electrical resistance respectively thereby affecting the overall properties of the conventional filler-matrix composites.

Further, the overall properties of the filler-matrix composite foam are sensitive to a volume fraction of the filler within the matrix. As a means to increase the overall properties of the filler-matrix an increase in volume fraction of the filler within the matrix is desired. However, with conventional nano-scale fillers, there exist several practical limits to deposit filler within the matrix due to the tendency for nano-scale fillers to agglomerate, thereby losing their nano-scale properties in the agglomerated form. Thus, the volume fraction of the nano-scale filler within the matrix is limited by processing-related limitations.

Thus, there is a need for improved composites for efficient thermal management in an electronic product, and an associated method of manufacturing such composite foam.

BRIEF DESCRIPTION

In one embodiment, a composite foam includes a metal template and a conformal atomic-scale film disposed directly over the metal template to form a 3-dimensional interconnected structure. The metal template includes a plurality of sintered interconnects, having a plurality of first non-spherical pores, a first non-spherical porosity, and a first surface-area-to-volume ratio. The conformal atomic-scale film has a plurality of second non-spherical pores, a second non-spherical porosity, and a second surface-area-to-volume ratio approximately equal to the first surface-area-to-volume ratio. The plurality of sintered interconnects has a plurality of dendritic particles and the conformal atomic-scale film includes at least one of a layer of graphene and a layer of hexagonal boron nitride.

In another embodiment, a composite foam includes a conformal atomic-scale film, a first material, and a second material. The conformal atomic-scale film includes a 3-dimensional interconnected structure, having a plurality of non-spherical pores, a non-spherical porosity, and a surface-area-to-volume ratio. The first material is disposed within the plurality of non-spherical pores formed in the conformal atomic-scale film and the second material is disposed in an empty space formed within the 3-dimensional interconnected structure. Such conformal atomic-scale film includes at least one of a layer of graphene and a layer of hexagonal boron nitride.

In one embodiment, a method of fabricating a composite foam includes sintering a plurality of dendritic particles at a pre-determined condition, to generate a metal template and depositing at least one of a layer of graphene and a layer of hexagonal boron nitride directly over the metal template to generate a conformal atomic-scale film. The metal template includes a plurality of sintered interconnects, having a plurality of first non-spherical pores, a first non-spherical porosity, and a first surface-area-to-volume ratio. The conformal atomic-scale film includes a 3-dimensional interconnected structure, having a plurality of second non-spherical pores, a second non-spherical porosity, and a second surface-area-to-volume ratio approximately equal to the first surface-area-to-volume ratio.

DRAWINGS

These and other features and aspects of embodiments of the present technology will become better understood when the following detailed description is read with reference to the accompanying drawings in which like characters represent like parts throughout the drawings, wherein:

FIG. 3 illustrates a perspective view of a composite foam having the metal template and a conformal atomic-scale film in accordance with the exemplary embodiment of FIG. 2;

FIG. 4b illustrates a sectional view of the composite foam in accordance with the exemplary embodiments of FIGS. 2, 3, and 4a;

FIG. 5b illustrates a sectional view of the composite foam in accordance with the exemplary embodiments of FIGS. 2, 3, and 5a;

FIG. 6b illustrates a sectional view of the composite foam in accordance with the exemplary embodiment of FIG. 6a;

FIG. 7 illustrates a schematic macro-scopic and micro-scopic view of a composite foam in accordance with one exemplary embodiment;

DETAILED DESCRIPTION

Embodiments discussed herein disclose a new composite foam for deployment in an electronics product, for example, as a thermal interface material and/or as a heat sink and/or as a heat spreader, and the like. Such composite foam provides a superior thermal, electrical and mechanical property to the underlying electronic product. In one embodiment of the present technology, the composite foam includes a metal template having high surface-area-to-volume ratio and a conformal atomic-scale film disposed directly over the metal template to form a 3-dimensional interconnected structure comprising the atomic-scale film. The metal template is formed by sintering a plurality of dendritic particles including a nickel and/or a copper of a suitable particle size distribution (PSD), at a controlled atmosphere to obtain the high surface-area-to-volume ratio. The conformal atomic-scale film, once deposited on the metal template, has an approximately equal surface-area-to-volume ratio as that of the metal template. The overall volume fraction of the atomic-scale conformal coating within the metal template's volume is then dictated by the thickness of the atomic-scale film (or the number of atomic layers) and the surface-area-to-volume ratio of the metal template. Therefore, such an approach reduces the processing (e.g. agglomeration) related limitations on nano-scale (or atomic-scale) fillers within composite systems. In another embodiment of the present technology, the composite foam includes a conformal atomic-scale film having a 3-dimensional interconnected structure, a first material disposed within a plurality of non-spherical pores formed in the conformal atomic-scale film, and a second material disposed in an empty space formed within the 3-dimensional interconnected structure. The conformal atomic-scale film in both the embodiments includes at least one of a layer of graphene and a layer of hexagonal boron nitride. Therefore, the metal in the starting metal template can be substituted with polymers to create a polymer-based composite material.

Figure 1:
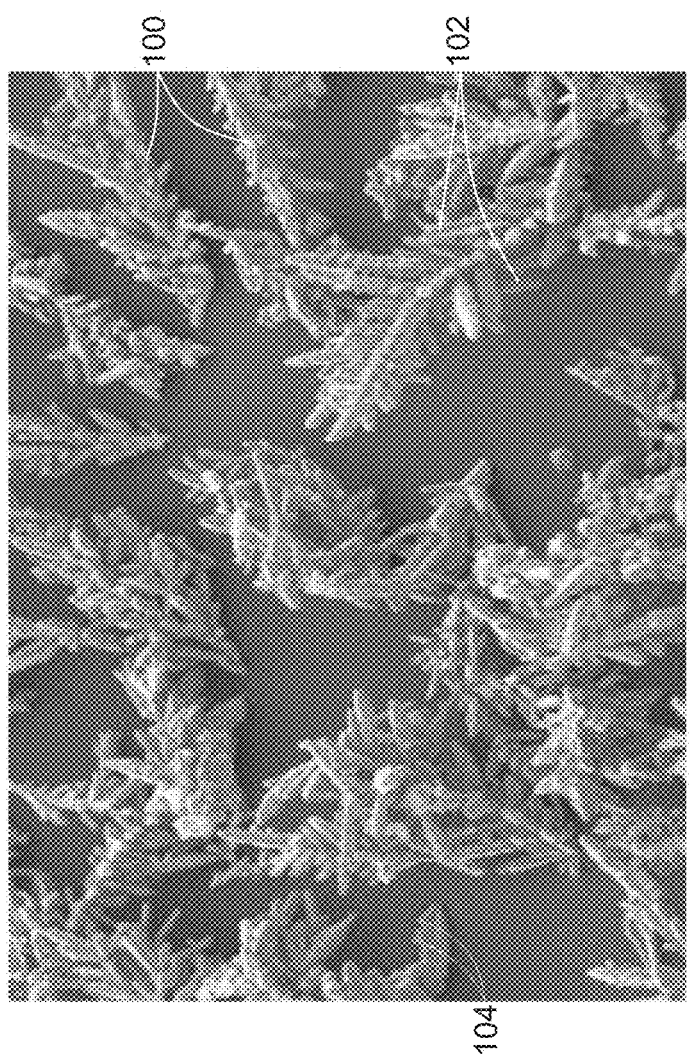
FIG. 1 illustrates a perspective view of a plurality of dendritic particles in accordance with one exemplary embodiment.

FIG. 1 represents a plurality of dendritic particles 100 used to generate a metal template (not shown in FIG. 1). The plurality of dendritic particles 100 is in a form of a metal powder. In one or more embodiments, suitable dendritic particles 100 include a copper and/or a nickel. In the illustrated embodiment, each dendritic particle 100 has a plurality of branches 102, and each branch 102 has a plurality of ligaments 104 and an aspect ratio. In one embodiment, the aspect ratio may be defined as a fraction of a length to a thickness of each ligament 104.

In one embodiment, the plurality of dendritic particles 100 may be chosen for generating the metal template because the dendritic particles 100 yields a higher surface-area-to-volume ratio in comparison with the metal template generated using spherical particles (not shown in FIG. 1). Each dendritic particle 100 has a size in a range from about 10 nanometers to about 100 micrometers. Similarly, the aspect ratio is in a range from about 2 to about 1000, and each ligament has a size in a range from about 1 nanometer to about 10 micrometers. In one embodiment, the plurality of dendritic particle 100 having a high aspect ratio aids in obtaining the metal template with high surface-area-to-volume fraction.

Figure 2:
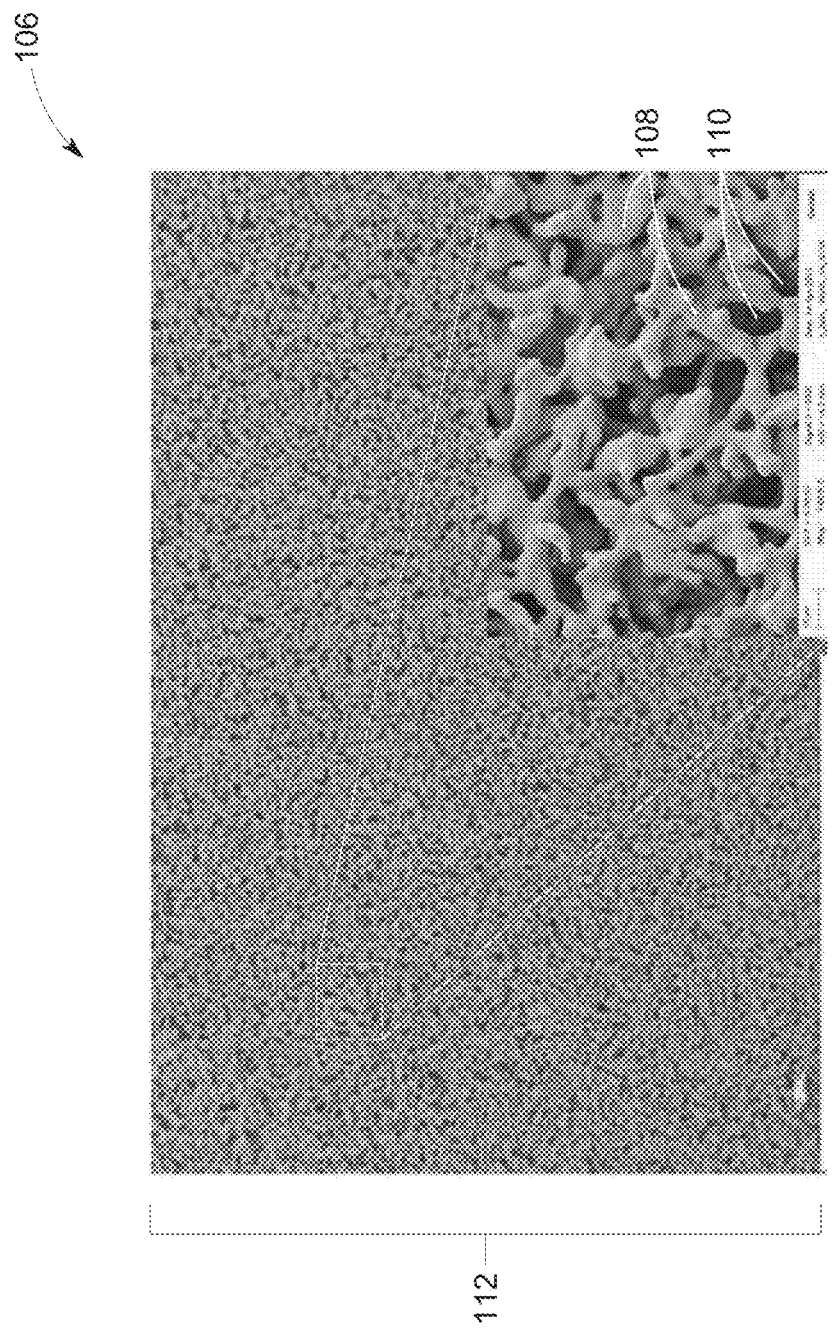
FIG. 2 illustrates a perspective view of a metal template in accordance with one exemplary embodiment.

FIG. 2 represents a metal template 106 generated by sintering the plurality of dendritic particles 100 in accordance with one exemplary embodiment.

The metal template 106 is primarily a sintered layer of a plurality of sintered interconnects 108. In one embodiment, the plurality of sintered interconnects 108 is obtained by sintering the plurality of dendritic particles 100. The metal template 106 further includes a plurality of first non-spherical pores 110, a first non-spherical porosity 112, and a first surface-area-to-volume ratio. In one embodiment, the first surface-area-to-volume ratio is in a range from about $10^4$ $m^2/m^3$ to about $10^8$ $m^2/m^3$ and each first non-spherical pores 110 has a size in a range from about 10 nanometers to about 10 micrometers. During operation of a composite foam (not shown in FIG. 2), a relatively smaller first non-spherical porosity 112 of the metal template 106, and a relatively higher first (and therefore, second) surface-to-volume-ratio, provides a higher heat transfer and electrical property to the underlying composite foam.

In one embodiment, the metal template 106 provides a space-efficient packing structure to enhance a specific surface area (i.e. a second surface-area-to-volume ratio) of a conformal atomic-scale film (not shown in FIG. 2) which may be deposited directly over the metal template 106. In such embodiments, the metal template 106 acts as a precursor layer that may influence shape, structure, and properties of the conformal atomic-scale film.

In the illustrated embodiment, the metal template 106 may have a flat profile. In certain other embodiments, the metal template 106 may have a tube profile, pipe profile, and the like. The profile of the metal template 106 detailed in the embodiments discussed herein should not be construed as a limitation of the present technology.

FIG. 3 represents a composite foam 114 having a conformal atomic-scale film 116 deposited directly over the metal template 106 in accordance with the exemplary embodiment of FIG. 2.

In the illustrated embodiment, the conformal atomic-scale film 116 includes a layer of graphene 116a and a layer of hexagon boron nitride 116b. In another embodiment, the conformal atomic-scale film 116 may include only a layer of graphene 116a or hexagon boron nitride 116b. While in some other embodiment, the conformal atomic-scale film 116 may include multiple layers of graphene 116a or hexagon boron nitride 116b arranged in a sequential or alternating manner. In another embodiment, the conformal atomic scale film may only include one or more atomic layers of Graphene (or hexagonal boron nitride) followed by a conformal metal coating (Cu or Ni) coating over the first atomic layer coating in a successively repeating structure. In one embodiment, the conformal atomic-scale film 116 is disposed directly over the metal template 106 using suitable deposition technique such as chemical vapor deposition (CVD) technique or an atomic layer deposition (ALD)

technique. The conformal atomic-scale film 116 continuously occupies surfaces of the underlying metal template 106 to form a 3-dimensional interconnected structure 118. In one embodiment, the 3-dimensional interconnected structure 118 conforms to a profile of the plurality of sintered interconnects 108. Further, the conformal atomic-scale film 116 includes a plurality of second non-spherical pores 120, a second non-spherical porosity 122, and a second surface-area-to-volume ratio. In one embodiment, the second surface-area-to-volume ratio is in a range from about $10^4$ m²/m³ to about $10^8$ m²/m³ and each second non-spherical pores 110 has a size in a range from about 10 nanometers to about 10 micrometers. During operation of the composite foam 114, a relatively smaller second non-spherical porosity 122 of the conformal atomic-scale film 116 provides a higher heat transfer and electrical property to the underlying composite foam 114.

In one embodiment, the second surface-area-to-volume ratio (i.e. specific surface area) of the conformal atomic-scale film 116 is approximately equal to the first surface-area-to-volume ratio of the metal template 106. The 3-dimensional interconnected structure 118 of the conformal atomic-scale film 116 provides superior thermal property to the composite foam 114.

Figure 4B:
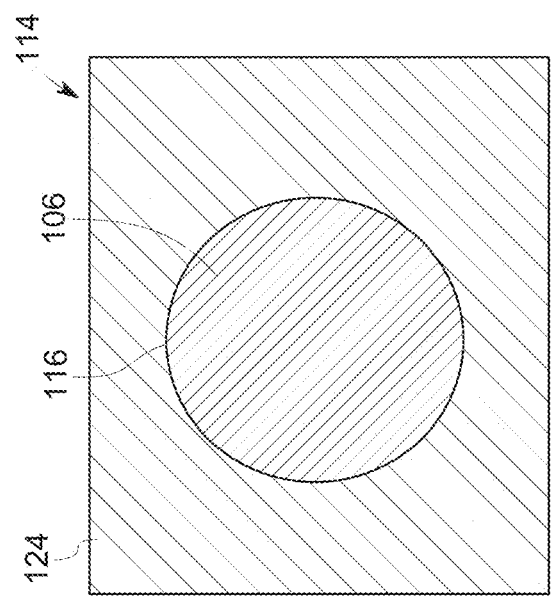
Figure 4A:
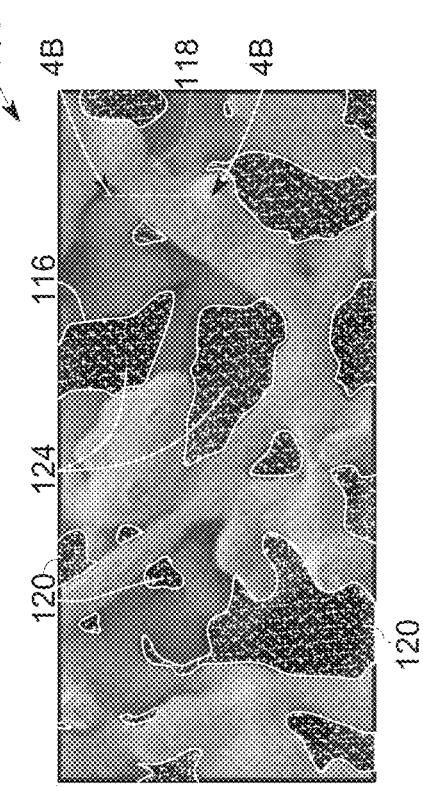
FIG. 4a illustrates a perspective view of the composite foam having a polymer material disposed within a plurality of non-spherical pores of the conformal atomic-scale film in accordance with the exemplary embodiments of FIGS. 2 and 3.

FIG. 4a represents the composite foam 114 having a polymer material 124 in accordance with the exemplary embodiments of FIGS. 2 and 3.

In the illustrated embodiment, the polymer material 124 is disposed within the plurality of second non-spherical pores 120 formed in the conformal atomic-scale film 116. In one embodiment, the polymer material 124 in a liquid form is infiltrated within the plurality of second non-spherical pores 120 and allowed to solidify so as to form the composite foam 114 (i.e. a polymer and metal composite foam). The polymer material 124 provides a good mechanical property and a moderate thermal property to the polymer and metal composite foam 114. In one or more embodiments suitable polymer material 124 includes an epoxy, a polydimethylsiloxane, a polyimide, and a silicone. A method of fabricating the polymer and metal composite foam 114 is explained in greater detail below.

FIG. 4b represents a sectional view taken along the 3-dimensional interconnected structure 118 of the polymer and metal composite foam 114 in accordance with the exemplary embodiments of FIGS. 2, 3, and 4a.

In the illustrated embodiment, the sectional view of the polymer and metal composite foam 114 represents the metal template 106 at a core, and surrounded by the layer of conformal atomic-scale film 116. Further, the conformal atomic-scale film 116 is surrounded by the polymer material 124. In one embodiment, suitable material for the metal template 106 includes a copper and a nickel. Similarly, suitable material for the conformal atomic-scale film 116 includes a graphene and a hexagon boron nitride, and suitable material for the polymer includes an epoxy, a polydimethylsiloxane, a polyimide, and a silicone.

Figure 5B:
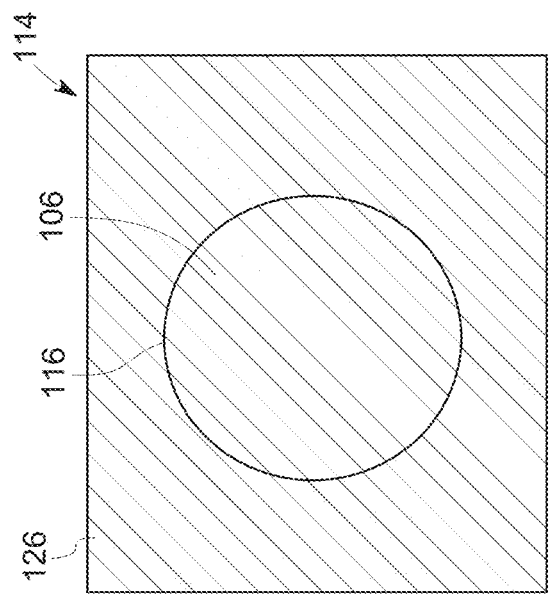
Figure 5A:
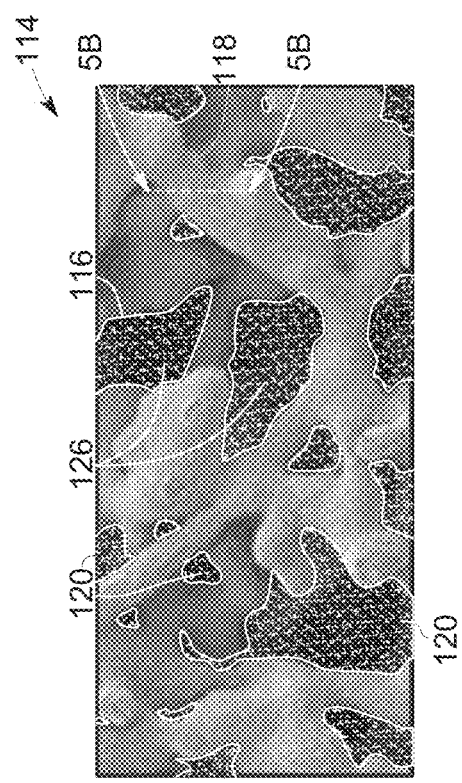
FIG. 5a illustrates a perspective view of the composite foam having a metal disposed within a plurality of non-spherical pores of the conformal atomic-scale film in accordance with the exemplary embodiments of FIGS. 2 and 3.

FIG. 5a represents the composite foam 114 having a metal 12 in accordance with the exemplary embodiments of FIGS. 2 and 3.

In the illustrated embodiment, the metal 126 is disposed within the plurality of second non-spherical pores 120 formed in the conformal atomic-scale film 116. In one embodiment, the metal 126 in a liquid form is infiltrated within the plurality of second non-spherical pores 120 and allowed to solidify so as to form the composite foam 114 (i.e. a metal composite foam). The metal 126 provides superior strength, electrical, and a thermal property to the metal composite foam 114. In one or more embodiments suitable metal 126 includes a copper and a nickel. In some embodiment, the metal 126 may correspond to the material of the plurality of dendritic particles 100 used to generate the metal template 106 so as to map the material which may yield a superior thermal, electrical, and mechanical property to the underlying composite foam 114. A method of fabricating the metal composite foam 114 is explained in greater detail below.

FIG. 5b represents a sectional view taken along the 3-dimensional interconnected structure 118 of the metal composite foam 114 in accordance with the exemplary embodiments of FIGS. 2, 3, and 5a.

In the illustrated embodiment, the sectional view of the metal composite foam 114 represents the metal template 106 at a core, and surrounded by the layer of conformal atomic-scale film 116. Further, the conformal atomic-scale film 116 is surrounded by the metal 126. In one embodiment, suitable material for the metal template 106 includes a copper and a nickel. Similarly, suitable material for the conformal atomic-scale film 116 includes a graphene and a hexagon boron nitride, and suitable material for the polymer includes an epoxy, a polydimethylsiloxane, a polyimide, and a silicone.

Figure 6B:
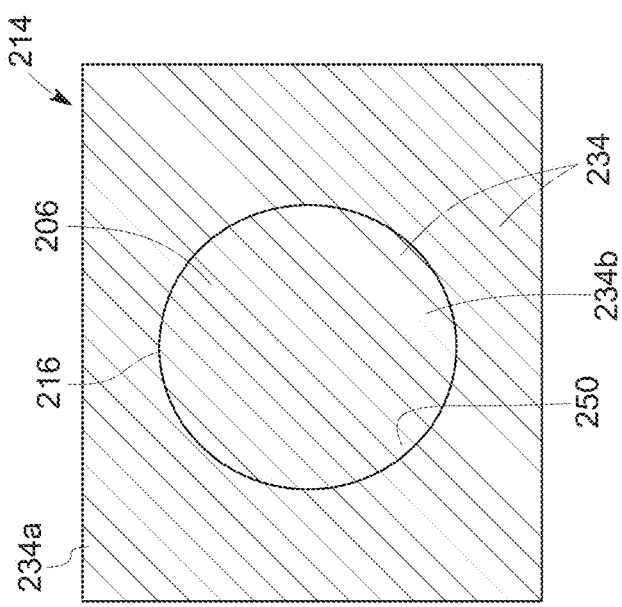
Figure 6A:
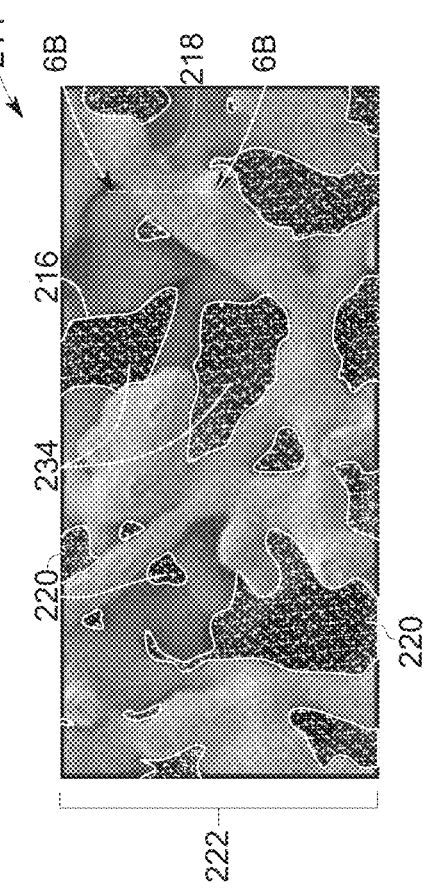
FIG. 6a illustrates a perspective view of a composite foam having a polymer material disposed within a plurality of non-spherical pores of a conformal atomic-scale film, and in an empty space formed within the 3-dimensional interconnected structure of the conformal atomic-scale film in accordance with another exemplary embodiment.

FIG. 6a represents a composite foam 214 in accordance with another exemplary embodiment.

In the illustrated embodiment, the composite foam 214 includes a conformal atomic-scale film 216 deposited over a metal template (not shown in FIG. 6a) to form a 3-dimensional interconnected structure 218.

The metal template includes a plurality of sintered interconnects (not shown in FIG. 6a) formed by sintering a plurality of dendritic particles (not shown in FIG. 6a) made of a copper and/or a nickel. The conformal atomic-scale film 216 is formed by directly depositing a layer of graphene and/or a layer of hexagon boron nitride over the metal template. The conformal atomic-scale film 216 includes a plurality of non-spherical pores 220, a non-spherical porosity 222, and a surface-area-to-volume ratio which is approximately equal to a surface-area-to-volume ratio of the metal template.

The composite foam 214 includes a polymer material 234 including a first material 234a and a second material 234b. In the illustrated embodiment, the first material 234a is disposed within the plurality of non-spherical pores 220 formed in the conformal atomic-scale film 216. In one embodiment, a first material 234a in a liquid form is infiltrated within the plurality of non-spherical pores 220 and allowed to solidify so as to form the composite foam 214. The polymer material 234 provides a good mechanical property and a moderate thermal property to the composite foam 214.

The metal template of the composite foam 214 is etched away using etchants such as hydrochloric acid and sulfuric acid to form an empty space 250 (as shown in FIG. 6b) within the 3-dimensional interconnected structure 218. In one embodiment, the empty space 250 may also be referred as a third non-spherical pores of the composite foam 214. The second material 234b is disposed in the empty space 250 formed within the 3-dimensional interconnected structure 218 so as to foam the composite foam 214 (i. e. a polymer composite foam). A method of fabricating the polymer composite foam 214 is explained in greater detail below.

FIG. 6b represents a sectional view taken along the 3-dimensional interconnected structure 218 of the polymer composite foam 214 in accordance with the exemplary embodiment of FIG. 6a.

In the illustrated embodiment, the sectional view of the polymer composite foam 214 represents the second material 234b at a core, and surrounded by the layer of conformal atomic-scale film 216. Further, the conformal atomic-scale film 216 is surrounded by the first material 234a. In one embodiment, suitable material for the conformal atomic-scale film 216 includes a graphene and a hexagon boron nitride, and suitable material for the first and second material includes a polymer material such as an epoxy, a polydimethylsiloxane, a polyimide, and a silicone. In another embodiment, the first material 234a may be different than the second material 234b.

FIG. 7 represents a macro-scopic and micro-scopic view of the composite foam 114 in accordance with one exemplary embodiment. The macro-scopic composite foam 114 may have different shape and may be fabricated according to an application and design criteria. The different shape of the macro-scopic composite foam 114 in one or more embodiments may conform to a shape of heat sink, a heat spreader, and the like. The composite foam 114 includes the 3-dimensional interconnected structure 118 and the polymer material 124 surrounding the 3-dimensional interconnected structure 118.

In the illustrated embodiment, the composite foam 114 is in a form of a matrix with the polymer material 124 occupying the plurality of non-spherical pores of the matrix and the 3-dimensional interconnected structure 118 is in a form of multiple fillers connecting all corners of the composite foam 114 to provide a high heat transfer, and electrical property to the composite foam 114.

Figure 8:
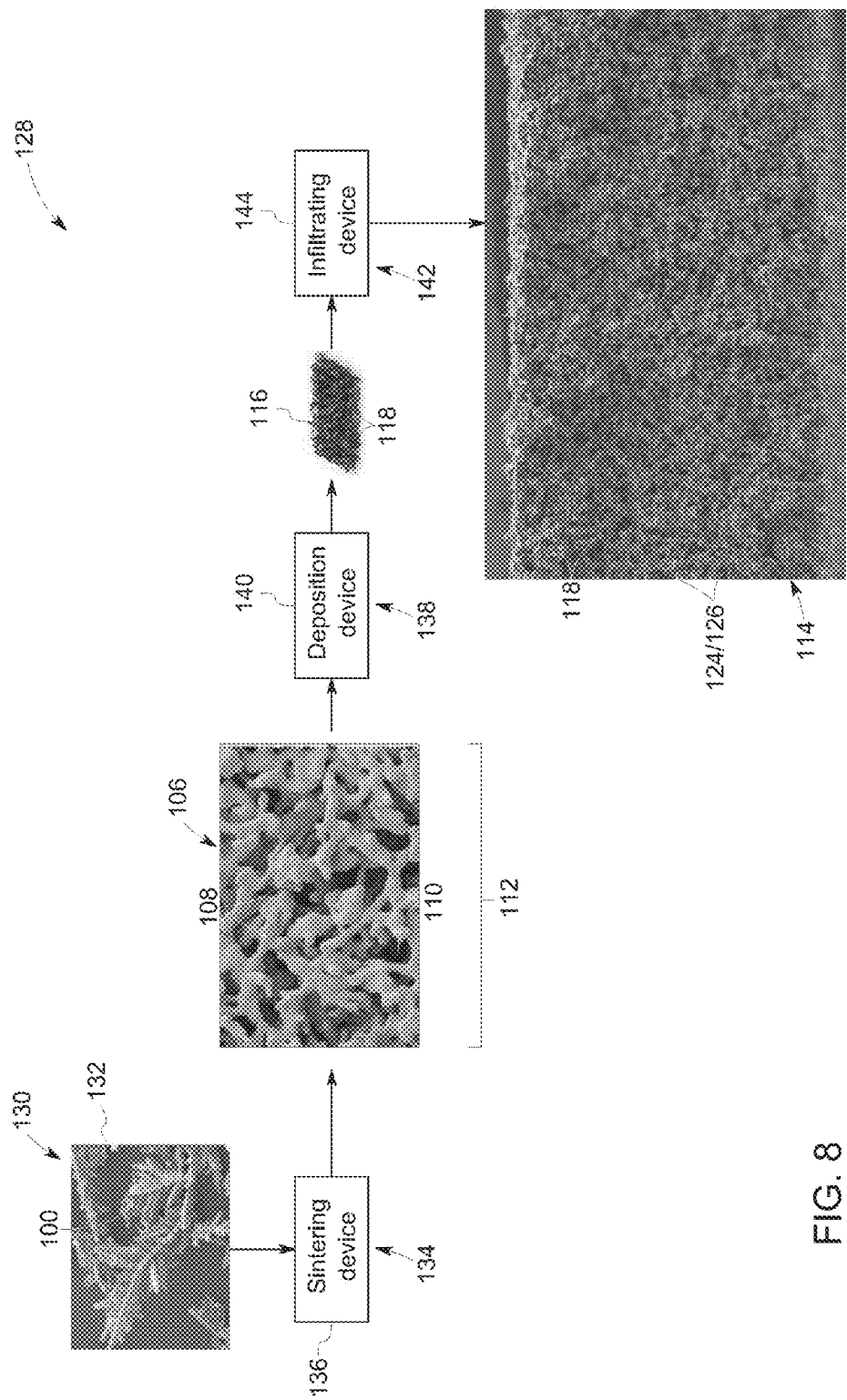
FIG. 8 illustrates a method of fabricating a composite foam in accordance with one exemplary embodiment.

FIG. 8 illustrates a method 128 of fabricating a composite foam 114 in accordance with one exemplary embodiment. The method 128 includes packing 130 a plurality of dendritic particles 100 in a casing 132. In one or more embodiments, suitable dendritic particles 100 include a copper and a nickel. In the illustrated embodiment, each dendritic particle 100 has a plurality of branches (as shown in FIG. 1), and each branch has a plurality of ligaments (as shown in FIG. 1) and an aspect ratio. Each dendritic particle 100 has a size in a range from about 10 nanometers to about 100 micrometers. Similarly, the aspect ratio is in a range from about 2 to about 1000, and each ligament has a size in a range from about 1 nanometer to about 10 micrometers.

The method 128 further includes sintering 134 the plurality of dendritic particles 100 via a sintering device 136, at a pre-determined condition to generate a metal template 106 including a plurality of sintered interconnects 108. In one embodiment, the pre-determined condition includes a temperature in a range from about 800 degrees centigrade to about 1100 degrees centigrade, and a reduction environment with hydrogen and nitrogen. The reducing condition prevents oxidation by removing oxygen and other oxidizing gases or vapors in the sintering device 136. The metal template 106 further includes a plurality of first non-spherical pores 110, a first non-spherical porosity 112, and a first surface-area-to-volume ratio. In one embodiment, the first surface-area-to-volume ratio is in a range from about $10^4$ $m^2/m^3$ to about $10^8$ $m^2/m^3$ and each first non-spherical pores 110 has a size in a range from about 10 nanometers to about 10 micrometers.

In another embodiment, the metal template 106 may be generated by etching techniques. In such embodiments, the plurality of dendritic particles 100 may be fused to each other and etched to form plurality of interconnects, which may have substantially the same shape as that of plurality of sintered interconnects 108.

The method 128 includes depositing 138 at least one of a layer of graphene 116a (as shown in FIG. 3) and a layer of hexagonal boron nitride 116b (as shown in FIG. 3) via a deposition device 140, directly over the metal template 106 to generate a conformal atomic-scale film 116 including a 3-dimensional interconnected structure 118. The conformal atomic-scale film 116 further includes a plurality of second non-spherical pores, a second non-spherical porosity (as shown in FIG. 3), and a second surface-area-to-volume ratio. In one embodiment, the second surface-area-to-volume ratio is in a range from about $10^4$ $m^2/m^3$ to about $10^8$ $m^2/m^3$ and each second non-spherical pores 110 has a size in a range from about 10 nanometers to about 10 micrometers. The second surface-area-to-volume ratio is approximately equal to the first surface-area-to-volume ratio. In one embodiment, suitable deposition device 140 uses a chemical vapor deposition (CVD) technique and an atomic layer deposition (ALD) technique.

The CVD technique uses either vacuum or ambient pressure conditions in the presence of methane or any other hydrocarbon (e.g. Benzene or its derivatives etc.) to continuously deposit the layer of graphene 116a over the surfaces of the metal template 106. In another embodiment, CVD technique uses either vacuum or ambient pressure conditions in the presence of borane gas to continuously deposit the layer of hexagon boron nitride 116b over the surfaces of the metal template 106. Further, the deposition 138 is performed at a temperature in a range from about 300 degrees centigrade to about 1100 degrees centigrade which may be substantially equal to, or preferably lower than, the temperature range used for sintering the plurality of dendritic particles 100.

In one embodiment, the method 128 further includes infiltrating 142 a polymer material 124 via an infiltrating device 144, within the plurality of second non-spherical pores formed in the conformal atomic-scale film 116 to generate the composite foam 114 (i.e. a polymer and metal composite foam). The infiltrating device 144 uses the polymer material 124 in liquid form, such as an epoxy, a polydimethylsiloxane, a polyimide, and a silicone to infiltrate the conformal atomic-scale film 116, and allow curing of the polymer material 124 for a predefined time such that the polymer material 124 in the liquid form becomes a gel (or solid, as the case maybe) and encapsulates the conformal atomic-scale film 116. Subsequently, the composite foam 114 may be dried by evaporation. In another embodiment, the infiltrated polymer material 124 may react and gets cross-linked to take a mechanical structure. In yet another embodiment, the polymer material 124 is a solid form is heated and infiltrated within the conformal atomic-scale film 116. The polymer material 124 in such embodiment solidifies upon allowing the polymer material 124 curing to the atmospheric temperature to take the mechanical structure. The polymer and metal composite foam 114 fabricated using the method described in FIG. 8 may correspond to the composite foam 114 illustrated in FIGS. 4a and 4b.

In another embodiment, the method 128 includes infiltrating 142 a metal 126 instead of the polymer material 124 via the infiltrating device 144, within the plurality of second non-spherical pores formed in the conformal atomic-scale film 116 to generate the composite foam 114 (i.e. a metal composite foam). In such embodiments, the infiltrating device 144 uses the metal 126 in liquid form or metal in a vapor form than can be conformably deposited, such as a copper and/or a nickel to infiltrate the conformal atomic-scale film 116, and allow the metal 126 to completely encapsulate the conformal atomic-scale film 116. The metal composite foam 114 fabricated using the method described in FIG. 8 may correspond to the composite foam 114 illustrated in FIGS. 5a and 5b.

Figure 9:
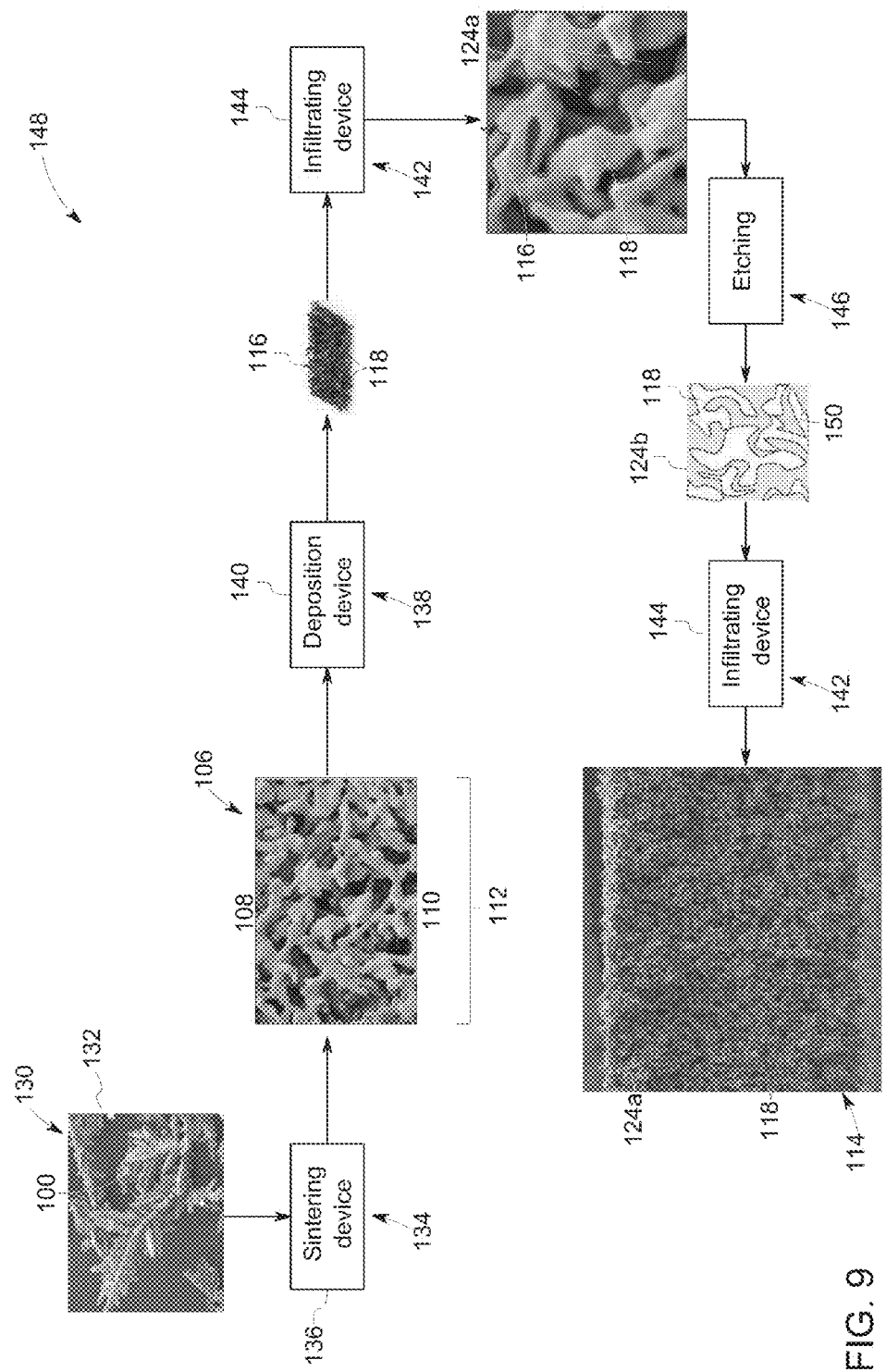
FIG. 9 illustrates a method of fabricating a composite foam in accordance with another exemplary embodiment.

FIG. 9 illustrates a method 148 of fabricating composite foam 114 in accordance with another exemplary embodiment. The method 148 may perform the same steps/process as detailed in the embodiment of FIG. 8 to generate the composite foam 114 having the conformal atomic-scale film 116 deposited over the metal template 106.

The method 148 includes infiltrating 142 the polymer material 124a via the infiltrating device 144, within the plurality of second non-spherical pores (as shown in FIG. 3). The method 148 further includes etching 146 the metal template 106 from the composite foam 114. The etching 146 includes using etchants such as a hydrochloric acid and a sulfuric acid to remove the metal template 106 and form an empty space 150 (voids) within the conformal atomic-scale film 116. Particularly, the etchants removes the plurality of sintered interconnects 108 of the metal template 106 covered by the 3-dimensional interconnected structure 118 so as to form empty space 150 within the 3-dimensional interconnected structure 118. In one embodiment, the empty space 150 may also be referred as a third non-spherical pores of the composite foam 114.

In one embodiment, the casing 132 used for holding the plurality of dendritic particles 100, may additionally function as another solid template or substrate to hold the composite foam 114 when the sintered portion (i.e. the sintered interconnects 108) of the metal template 106 is etched away using etchants. In one or more embodiments, suitable material for the casing 132 includes metal and ceramic. Thus, the 3-dimensional interconnected structure 118 may function as a freestanding structure, even without infiltrating polymer material 124 within the second non-spherical pores 120 of the conformal atomic-scale film 116.

Subsequently, the method 148 includes infiltrating 142 the second material 124b via the infiltrating device 144, within the plurality of empty space 150 formed within the 3-dimensional interconnected structure 118 so as to foam the composite foam 114 (i.e. a polymer composite foam). In one or more embodiments, suitable first and second materials 124 include an epoxy, a polydimethylsiloxane, a polyimide, and a silicone. The polymer composite foam 114 fabricated using the method described in FIG. 9 may correspond to the composite foam 214 illustrated in FIGS. 6a and 6b.

Figure 10:
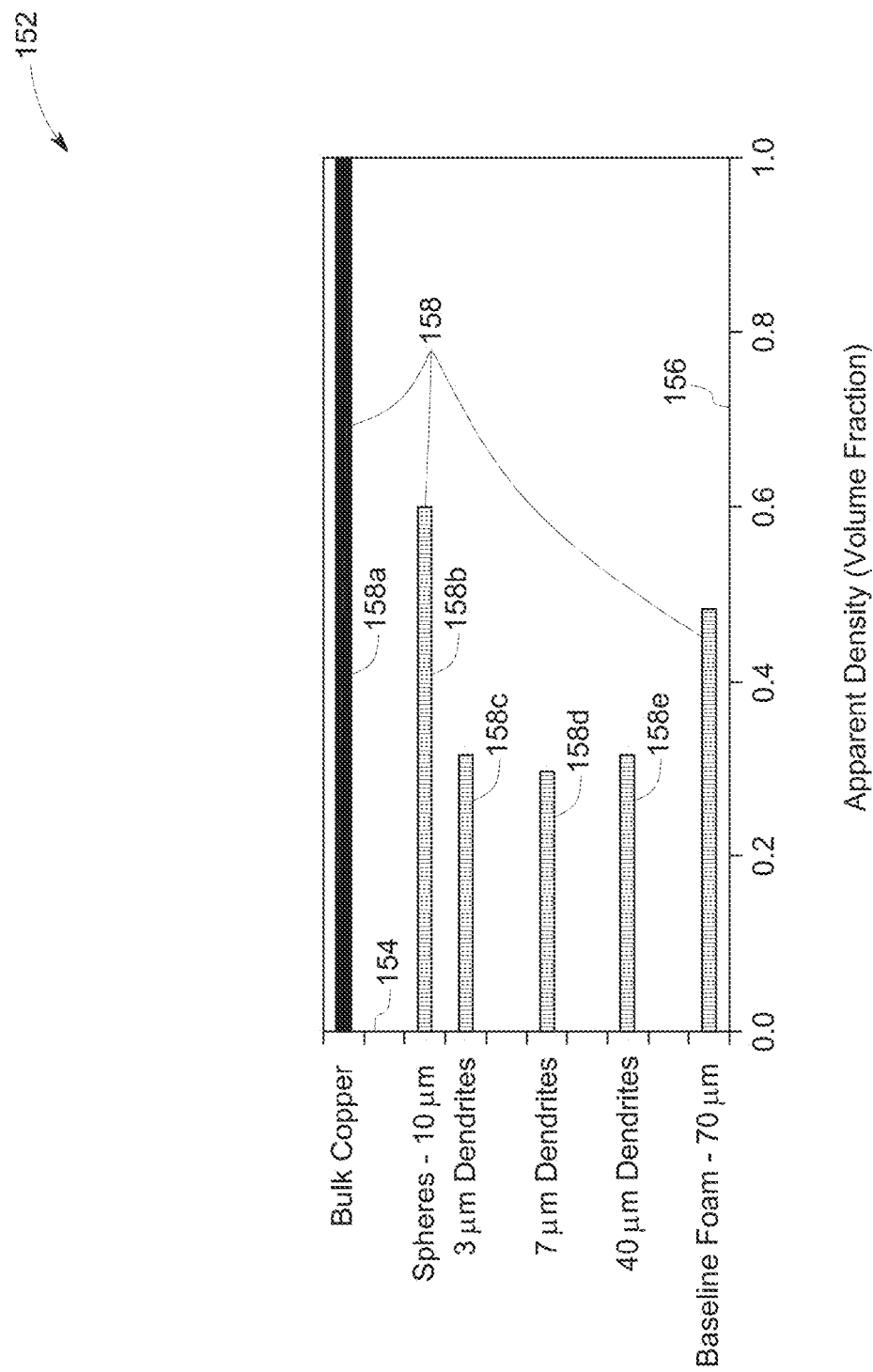
FIG. 10 illustrates a bar chart representing a plurality of particles and a density of a composite foam in accordance with one exemplary embodiment.

FIG. 10 illustrates a chart 152 having a plurality of particles used for fabricating composite foam represented along a y-axis 154 and a density of the composite foam represented along an x-axis 156 in accordance with one exemplary embodiment. The chart 152 further includes a plurality of bars 158 indicating the density of the fabricated composite foam based on a shape, size, and type of particles used in the composite foam.

In the illustrated embodiment, a bar 158a represents the density of the composite foam fabricated using a bulk copper. It is clearly evident that such composite foam has a high density. Similarly, a bar 158b represents the density of the composite foam fabricated using a plurality of spherical particles having a size at about 10 micrometers. Such composite foam has a moderate density. However, a bar 158c, 158d, 158e represents the density of the composite foams fabricated using a plurality of dendritic particles having a size in a range from about 3 micrometers to about 40 micrometers. From the chart 152 it may be clearly evident that the composite foam fabricated using the plurality of dendritic particles has very less density or volume fraction in comparison with other commercially available composite foams.

Figure 11:
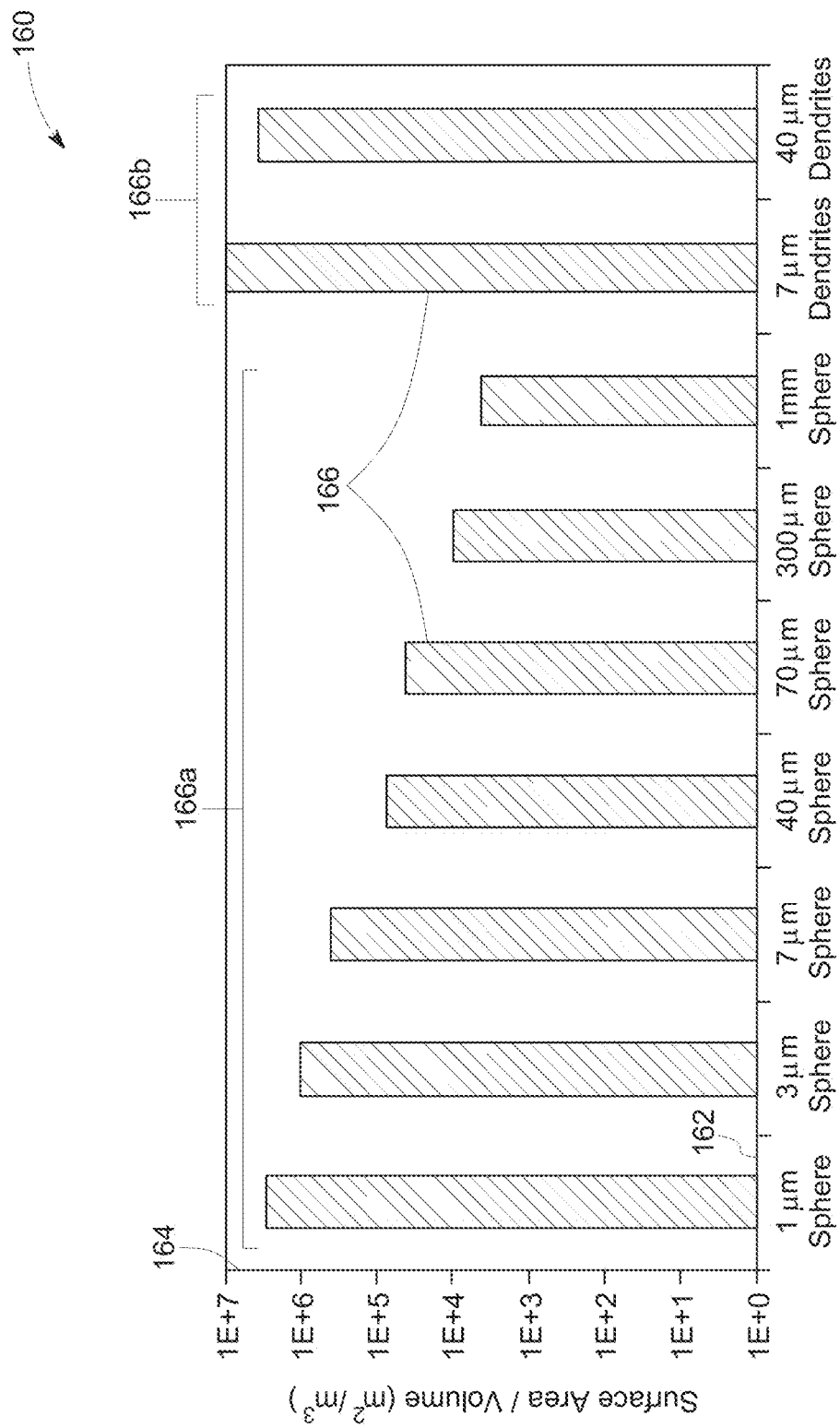
FIG. 11 illustrates a bar chart representing a particle size and a surface-area-to-volume ratio of a composite foam in accordance with one exemplary embodiment.

FIG. 11 illustrates a chart 160 having a size of the plurality of particles used for fabricating composite foam represented along an x-axis 162 and a surface-area-to-volume ratio of the composite foam represented along a y-axis 164 in accordance with one exemplary embodiment. The chart 160 further includes a plurality of bars 166 indicating the surface-area-to-volume (SAV) fraction of the fabricated composite foam based on a size and type of particles used in the composite foam.

In the illustrated embodiment, a bar 166a represents the SAV fraction of the composite foam fabricated using a plurality of spherical particles having size in a range from about 1 micrometer to about 1 millimeter. It is clearly evident that SAV fraction of such composite foam decreases as the size of the particle increases. Similarly, a bar 166b represents the SAV fraction of the composite foam fabricated using a plurality of dendritic particles having a size at about 7 micrometers to about 40 micrometers. Such composite foams have marginal decrease in the SAV fraction as the size of the dendritic particles increases. Further, from the chart 162 it may be clearly evident that the composite foam fabricated using the plurality of dendritic particles has high SAV fraction in comparison with other commercially available composite foams fabricated using the plurality of spherical particles.

Figure 12:
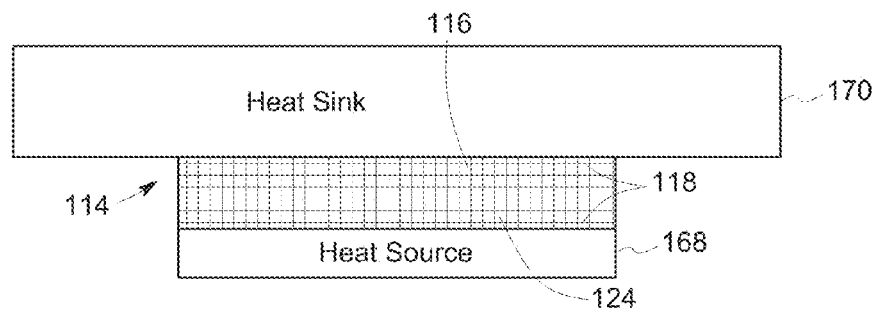
FIG. 12 illustrates a schematic view of a composite foam used as a thermal interface material in accordance with one exemplary embodiment.

FIG. 12 represents the composite foam 114 (i.e. a polymer composite foam) used as a thermal interface material in accordance with one exemplary embodiment. In the illustrated embodiment, the composite foam 114 has a flat profile and is disposed between the heat source 168 such as semiconductor integrated circuit, and a heat sink 170. The composite foam 114 includes the conformal atomic-scale film 116 having the 3-dimensional interconnected structure 118 and the polymer material 124 disposed surrounding the 3-dimensional interconnected structure 118. The composite foam 114 conducts heat from the heat source 168 to the heat sink 170 via the 3-dimensional interconnected structure 118. In one embodiment, the conformal atomic-scale film 116 includes a layer of graphene and/or a hexagon boron nitride. The polymer material 124 includes an epoxy, a polydimethylsiloxane, a polyimide, and a silicone. In one embodiment, such polymer material 124 may provide flexibility to the composite foam 114.

Figure 13:
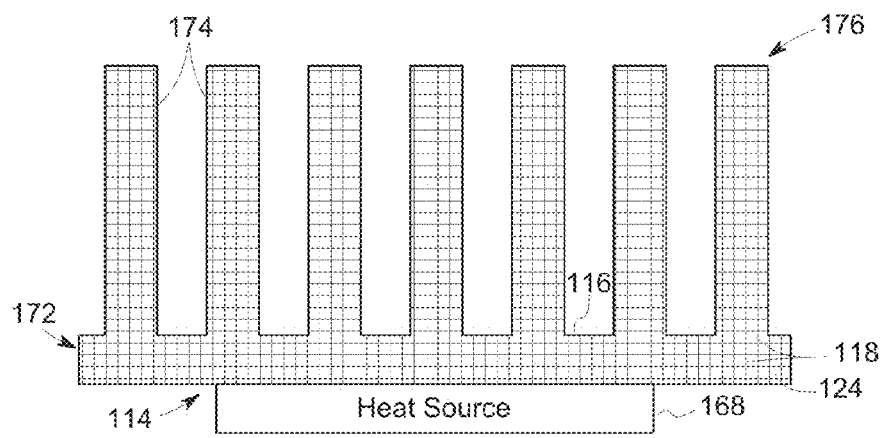
FIG. 13 illustrates a schematic view of a composite foam used as a heat sink in accordance with one exemplary embodiment.

FIG. 13 represents the composite foam 114 (i.e. a polymer composite foam) used as a heat sink in accordance with one exemplary embodiment. In the illustrated embodiment, the composite foam 114 has a flat section 172 and a plurality of projections 174 extending from the flat section 172. The composite foam 114 is disposed on the heat source 168. The composite foam 114 includes the conformal atomic-scale film 116 having the 3-dimensional interconnected structure 118 and the polymer material 124 disposed surrounding the 3-dimensional interconnected structure 118. The composite foam 114 conducts heat from the heat source 168 to an ambient atmosphere 176 via the 3-dimensional interconnected structure 118. In one embodiment, the conformal atomic-scale film 116 includes a layer of graphene and/or a hexagon boron nitride. The polymer material 124 includes an epoxy, a polydimethylsiloxane, a polyimide, and a silicone.

Figure 14:
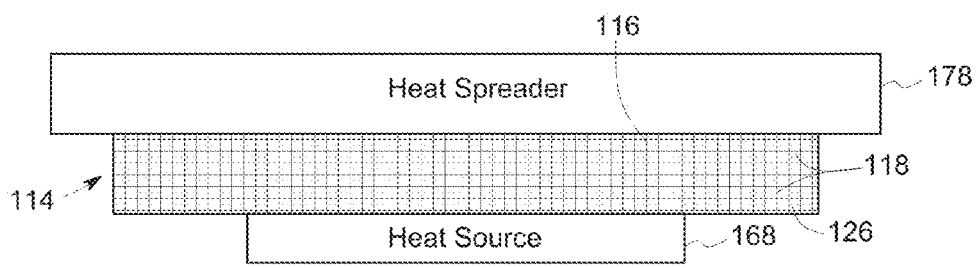
FIG. 14 illustrates a schematic view of a composite foam used as a heat spreader in accordance with one exemplary embodiment.

FIG. 14 represents the composite foam 114 (i.e. a metal composite foam) used as a heat spreader in accordance with one exemplary embodiment. In the illustrated embodiment, the composite foam 114 has a flat profile and is disposed between the heat source 168 such as a semiconductor integrated circuit, and a heat exchanger 178. The composite foam 114 includes the conformal atomic-scale film 116 having the 3-dimensional interconnected structure 118 and the metal 126 disposed surrounding the 3-dimensional interconnected structure 118. The composite foam 114 conducts heat from the heat source 168 to the heat exchanger 178 via the 3-dimensional interconnected structure 118 and the metal 126 of the conformal atomic-scale film 116. In one embodiment, the conformal atomic-scale film 116 includes a layer of graphene and/or a hexagon boron nitride and the metal 126 includes a copper and a nickel.

In accordance with certain embodiments discussed herein, composite foam of the present technology facilitates a high electrical, thermal, and mechanical property. The metal template of the present technology provides a high surface-area-to-volume fraction and acts as a precursor layer for directly depositing a conformal atomic-scale film having substantially equal SAV fraction of that of the metal template, over the metal template. Further, such composite foam has a less density for the given weight of the foam. The composite foam of the present technology may replace solid metals used in electronics packaging applications. Further, the composite foam having a 3-dimensional interconnected structure provides an efficient heat transfer and electrical property to the composite foam, without any interface heat transfer between the filler and matrix. Such structures may provide performance and reliability advantages over the conventional metal based foams.

While only certain features of embodiments have been illustrated and described herein, many modifications and changes will occur to those skilled in the art. It is, therefore, to be understood that the appended embodiments are intended to cover all such modifications and changes as falling within the spirit of the technology.

The invention claimed is:

1. A composite foam comprising:
 a metal template comprising a plurality of sintered interconnects, having a plurality of first non-spherical pores, a first non-spherical porosity, and a first surface-area-to-volume ratio, wherein the plurality of sintered interconnects comprises a plurality of dendritic particles; and
 a conformal atomic-scale film disposed directly over the metal template to form a 3-dimensional interconnected structure, having a plurality of second non-spherical pores, a second non-spherical porosity, and a second surface-area-to-volume ratio approximately equal to the first surface-area-to-volume ratio, wherein the 3-dimensional interconnected structure conforms to a profile of the plurality of sintered interconnects comprising the plurality of dendritic particles, wherein each dendritic particle comprises a plurality of branches, and wherein each branch comprises a plurality of ligaments;
 wherein the conformal atomic-scale film comprises at least one of a layer of graphene and a layer of hexagonal boron nitride.

2. The composite foam of claim 1, further comprising a polymer material disposed within the plurality of second non-spherical pores formed in the conformal atomic-scale film.

3. The composite foam of claim 1, further comprising a metal disposed within the plurality of second non-spherical pores formed in the conformal atomic-scale film.

4. The composite foam of claim 1, wherein each dendritic particle has a size in a range from about 10 nanometers to about 100 micrometers.

5. The composite foam of claim 1, wherein each dendritic particle has a plurality of branches with an aspect ratio in a range from about 2 to about 1000.

6. The composite foam of claim 5, wherein each branch comprises a plurality of ligaments and wherein each ligament has a size in a range from about 1 nanometer to about 10 micrometers.

7. The composite foam of claim 1, wherein the first and second surface-area-to-volume ratios are in a range from about $10^4$ $m^2/m^3$ to about $10^8$ $m^2/m^3$.

8. The composite foam of claim 1, wherein each pore among the plurality of first and second non-spherical pores has a size in a range from about 10 nanometers to about 10 micrometers.

9. A composite foam comprising:
 a metal template comprising a plurality of sintered interconnects, having a plurality of first non-spherical pores, a first non-spherical porosity, and a first surface-area-to-volume ratio, wherein the plurality of sintered interconnects comprises a plurality of dendritic particles; and
 a conformal atomic-scale film disposed directly over the metal template to form a 3-dimensional interconnected structure, having a plurality of second non-spherical pores, a second non-spherical porosity, and a second surface-area-to-volume ratio approximately equal to the first surface-area-to-volume ratio, wherein the 3-dimensional interconnected structure conforms to a profile of the plurality of sintered interconnects comprising the plurality of dendritic particles, wherein each dendritic particle comprises a plurality of branches, and wherein each branch comprises a plurality of ligaments;
 a first material disposed within the plurality of second non-spherical pores formed in the conformal atomic-scale film; and
 a second material disposed in an empty space formed within the 3-dimensional interconnected structure, wherein the first material and the second material comprise a polymer material,
 wherein the conformal atomic-scale film comprises at least one of a layer of graphene and a layer of hexagonal boron nitride.

10. The composite foam of claim 9, wherein the surface-area-to-volume ratio is in a range from about $10^4$ $m^2/m^3$ to about $10^8$ $m^2/m^3$.

11. The composite foam of claim 9, wherein each dendritic particle has a size in a range from about 10 nanometers to about 100 micrometers.

* * * * *